US009344035B2

(12) United States Patent
Bevilacqua et al.

(10) Patent No.: US 9,344,035 B2
(45) Date of Patent: May 17, 2016

(54) SYSTEM AND METHOD FOR A VOLTAGE CONTROLLED OSCILLATOR

(71) Applicant: Infineon Technologies AG, Neubiberg (DE)

(72) Inventors: Andrea Bevilacqua, Padua (IT); Marc Tiebout, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/323,718

(22) Filed: Jul. 3, 2014

(65) Prior Publication Data

US 2016/0006394 A1    Jan. 7, 2016

(51) Int. Cl.
*H03B 5/08* (2006.01)
*H03B 5/12* (2006.01)
*H03F 3/45* (2006.01)
*H03B 1/00* (2006.01)
*H03F 3/04* (2006.01)

(52) U.S. Cl.
CPC ............... *H03B 5/1212* (2013.01); *H03B 1/00* (2013.01); *H03B 5/124* (2013.01); *H03B 5/1256* (2013.01); *H03F 3/04* (2013.01); *H03F 3/45278* (2013.01)

(58) Field of Classification Search
CPC ......... H03F 3/45278; H03F 3/04; H03B 1/00; H03B 2201/0208
USPC ........... 330/252, 253; 331/167, 177 V, 117 R, 331/117 FE
See application file for complete search history.

(56) References Cited

U.S. PATENT DOCUMENTS

2003/0112069 A1* 6/2003 Kim et al. ............... 330/252
2006/0238266 A1* 10/2006 Harjani et al. ............ 331/167

OTHER PUBLICATIONS

Ahmed, S.S. et al., "Advanced Microwave Imaging," IEEE Microwave Magazine, vol. 13, No. 6, Sep.-Oct. 2012, pp. 26-43.
Kwok, K. et al.,"A 23-to-29GHz Differentially Tuned Varactorless VCO in 0.13µm CMOS," EEE International Solid-State Circuits Conference, ISSCC 2007, Session 10, mm-Wave Transceivers and Building Blocks, 10.4, Digest of Technical Papers., Feb. 2007, 3 pgs.
Lesson, D.B., "A Simple Model of Feedback Oscillator Noise Spectrum," Proceedings of the IEEE, vol. 54, No. 2, Feb. 1966, pp. 329-330.
Niknejad, A., "Lecture 23: Negative Resistance Osc, Differential Osc, and VCOs," University of California, EECS 142, Lecture 23, 2005, pp. 28.
Padovan, F. et al., "A K-band SiGe Bipolar VCO with Transformer-Coupled Varactor for Backhaul Links," IEEE 13th Topical Meeting on Silicon Monolithic Integrated Circuits in RF Systems (SiRF), Jan. 2013, pp. 108-110.
Padovan, F. et al., "A SiGe Bipolar for VCO Backhaul E-Band Communication Systems," 2012 Proceedings of the ESSCIRC, Sep. 2012, pp. 402-405.
Tiebout, M., "A CMOS Fully Integrated 1 GHz and 2 GHz Dual Band VCO with a Voltage Controlled Inductor," Proceedings of the 28th European Solid-State Circuits Conference, ESSCIRC 2002, Sep. 2002, pp. 799-802.

(Continued)

*Primary Examiner* — Arnold Kinkead
(74) *Attorney, Agent, or Firm* — Slater Matsil, LLP

(57) ABSTRACT

In accordance with an embodiment, an oscillator includes a tank circuit and an oscillator core circuit having a plurality of cross-coupled compound transistors coupled to the tank circuit. Each of the plurality of compound transistors includes a bipolar transistor and a field effect transistor (FET) having a source coupled to a base of the bipolar transistor.

24 Claims, 4 Drawing Sheets

(56) References Cited

OTHER PUBLICATIONS

Wohlmuth, H.D. et al., "2 GHz Meissner VCO in Si Bipolar Technology," 29th European Microwace Conference, vol. 1, Oct. 1999, pp. 190-193.

"Unleash RF: Unleash the performance of your RF and microwave designs," NXP Semiconductors, N.V., www.nxp.com/unleash-rf, Date of release: Jan. 2013, 16 pgs.

* cited by examiner

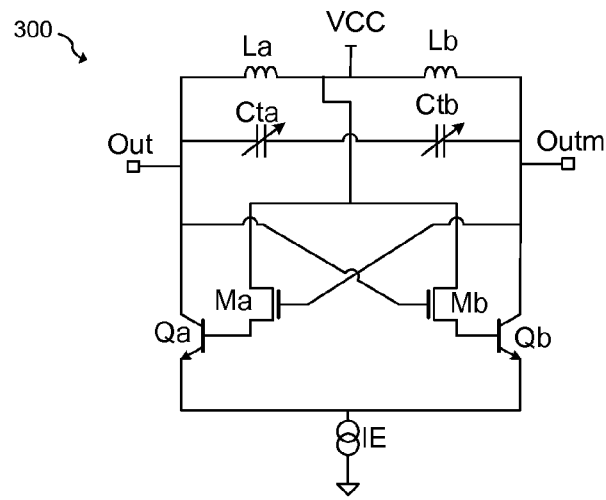
*FIG. 3*
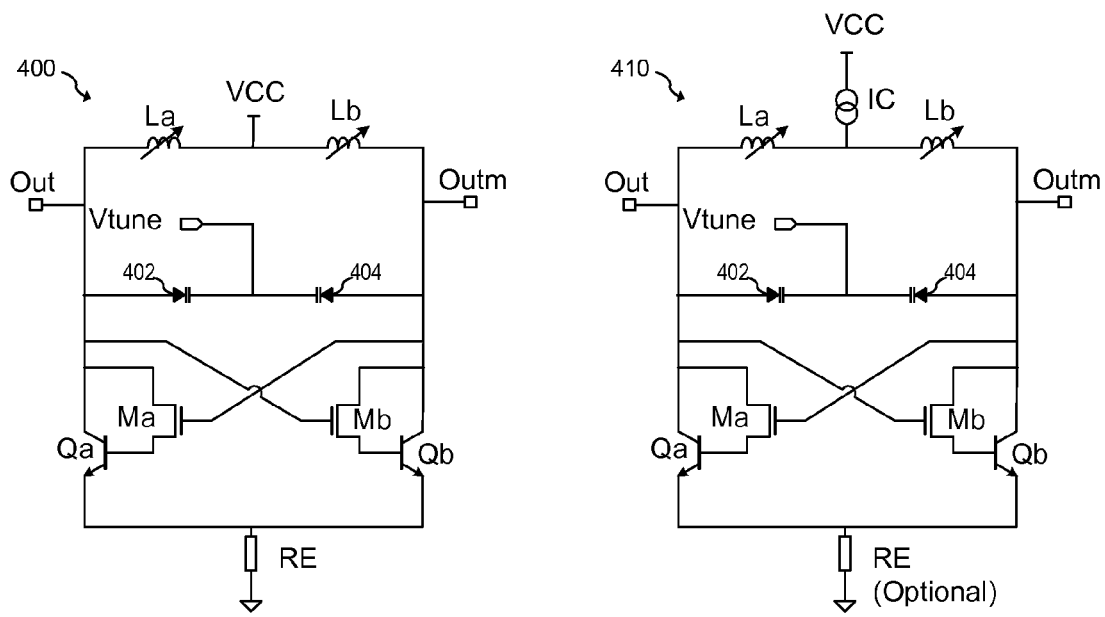
*FIG. 4a*  *FIG. 4b*

SYSTEM AND METHOD FOR A VOLTAGE CONTROLLED OSCILLATOR

TECHNICAL FIELD

The present disclosure relates generally to an electronic device, and more particularly to a system and method for an oscillator.

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar and multi-gigabit communication systems.

In some radar systems, the distance between the radar and a target is determined by transmitting a frequency modulated signal, receiving a reflection of the frequency modulated signal, and determining a distance based on a time delay and/or frequency difference between the transmission and reception of the frequency modulated signal. Resolution, accuracy and sensitivity of the radar system may depend, in part, on the phase noise performance and frequency agility of the radar's frequency generation circuitry, which generally includes an RF oscillator and circuitry that controls the frequency of the RF oscillator. One of the factors that affects phase noise performance is the amplitude of the oscillation signal produced by the RF oscillator. However, in many RF oscillators, the saturation of active devices used to generate the oscillations may limit the amplitude of the oscillation signal.

SUMMARY OF THE INVENTION

In accordance with an embodiment, an oscillator includes a tank circuit and an oscillator core circuit having a plurality of cross-coupled compound transistors coupled to the tank circuit. Each of the plurality of compound transistors includes a bipolar transistor and a field effect transistor (FET) having a source coupled to a base of the bipolar transistor.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates an oscillator according to another embodiment;
FIGS. 4a-b illustrates an oscillators according to further embodiments.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for an oscillator, such as a voltage controlled oscillator (VCO). The invention may also be applied to systems and applications that use RF oscillators, such as general radar systems and wireless communications systems.

In embodiments of the present invention, a low phase-noise oscillator utilizes an oscillator core implemented using a compound device that includes a bipolar transistor and a field effect transistor (FET) such as a metal-oxide semiconductor FET. The source of the FET is coupled to the base of the bipolar transistor in the compound device to help prevent the bipolar transistor from entering saturation.

In general, the phase noise of an RF oscillator as a function of frequency offset $\Delta\omega$ can be heuristically described using Leeson's equation:

$$L(\Delta\omega) = \frac{FkT}{2P_{sig}}\left[1 + \left(\frac{\omega_c}{2Q\Delta\omega}\right)^2\right],$$

where F is the noise factor of the active devices within the oscillator circuit, k is Boltzman's constant, T is the temperature in degrees Kelvin, $P_{sig}$ is the signal power in the tank or resonator of the oscillator, $\omega_c$ is the corner frequency for flicker noise, Q is the quality factor of the tank or resonator of the oscillator, and $\Delta\omega$ represents the frequency offset. From Leeson's equation it can be seen that the phase noise is inversely proportional to the signal power $P_{sig}$. Thus, in most embodiments, the phase noise of an oscillator may be reduced if the oscillation amplitude is increased.

Figure 1:
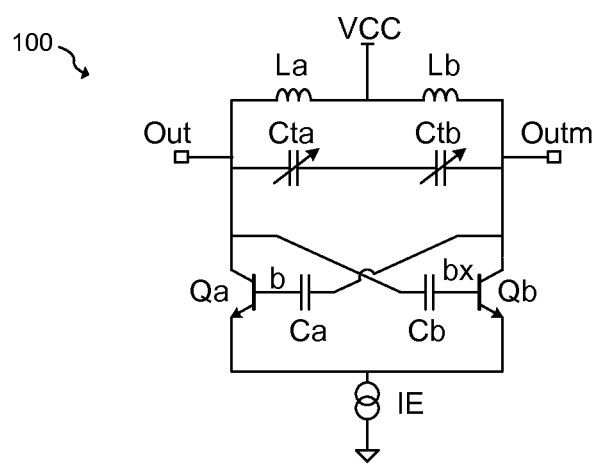
FIG. 1 illustrates a conventional oscillator.

FIG. 1 illustrates a conventional VCO 100 that includes bipolar transistors Qa and Qb, and a tank circuit implemented using inductors La and Lb and capacitors C1a and C2b. During operation, transistors Qa and Qb synthesize a negative resistance that counteracts parasitic resistances in the tank and provides power to the tank in order to sustain oscillations. Capacitors C2a and C2b are used to bias the bases of transistors Qa and Qb. However, as the bias current is increased, transistors Qa and Qb will enter saturation and limit the oscillation amplitude.

The frequency of oscillation of VCO 100 is approximately:

$$f_{osc} = \frac{1}{2\pi\sqrt{LC}},$$

where L is the sum of inductances La and Lb and C is the capacitance of capacitors Cta and Ctb coupled in series.

Figure 2:
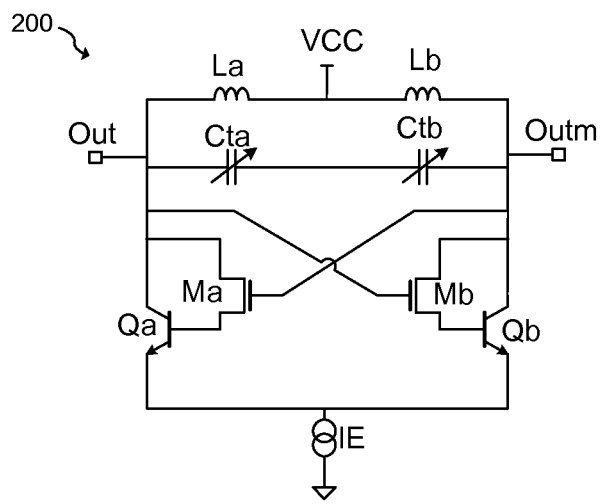
FIG. 2 illustrates an embodiment oscillator.

FIG. 2 illustrates oscillator 200 according to an embodiment of the present invention. Here, the sources of NMOS transistors Ma and Mb are coupled to the bases of transistors Qa and Qb respectively. In the illustrated embodiment, the source of NMOS transistors Ma and Mb are directly connected to the bases of bipolar transistors Qa and Qb respectively. However, in alternative embodiments, other elements may be coupled between the sources of NMOS transistors Ma and Mb and the bases of bipolar transistors Qa and Qb. Since NMOS transistors Ma and Mb help prevent transistors Qa and Qb from entering saturation, a higher oscillation amplitude may be supported. In addition, the fact that MOS transistors have a higher gate-source voltage at higher drain currents also helps support higher oscillation amplitudes and lower phase noise.

As shown, bipolar transistor Qa and NMOS transistor Ma form one compound device and bipolar transistor Qb and NMOS transistor Mb form another compound device that are cross-coupled with each other. Further, the drain of NMOS transistor Ma is coupled to the collector of bipolar transistor Qa, and the drain of NMOS transistor Mb is coupled to the drain of bipolar transistor Qb. In some embodiments, other transistors types besides npn bipolar transistors may be used to implement bipolar transistors Qa and Qb, and transistor types besides NMOS transistors may be used to implement FETs Ma and Mb. For example, in some embodiments, transistors Qa and Qb may be implemented using pnp bipolar transistors and transistors Ma and Mb may be implemented using PMOS transistors. In further alternative embodiments, the bulk nodes of Ma and Mb may be to their respective source nodes instead of to substrate, (NMOS) or to power supply node VCC (PMOS).

In an embodiment, inductors La and Lb may be implemented using various types of inductors such as discrete inductors, on-chip inductors, on-chip transformers, and transmission line elements. On-chip inductors may include, for example, spiral inductors fabricated in one or more metal layers of an integrated circuit. Adjustable capacitors Cta and Ctb may be implemented using, for example, switchable capacitor networks, varactor diodes and/or other adjustable capacitor circuits and systems known in the art. In some embodiments, oscillator 200 may be implemented as a VCO, for example by implementing adjustable capacitance capacitors Cta and Ctb as varactor diodes or MOS-Varactors having a capacitance controllable by a voltage. Alternatively, other structures or components having a an adjustable capacitance may be used to implement capacitors Cta and Ctb.

In an embodiment, the output of oscillator 200 is taken differentially at nodes Out and Outm coupled to the tank circuit of oscillator 200. In some embodiments, these nodes may be buffered using a high frequency buffer circuit known in the art. Alternatively, a doubled frequency may be taken in a single-ended fashion at the emitters of bipolar transistors Qa and Qa.

FIG. 3 illustrates a further embodiment oscillator 300 in which NMOS transistors Ma and Mb are operated as source followers. Here the drains of NMOS transistors Ma and Mb are connected to power supply node VCC instead of to the respective collectors of bipolar transistors Qa and Qb as shown in FIG. 2. This source follower configuration also helps support higher oscillation amplitudes and lower phase noise.

FIG. 4a illustrates an embodiment VCO 400 in which the adjustable capacitances are implemented using varactors 402 and 404, which may be implemented as diodes having a capacitance that is inversely proportional to the voltage applied across its terminals. This decrease in applied voltage may be due to the increase of the width of the depletion region in the reversed bias diode that causes a corresponding decrease in its capacitance. In an embodiment, the capacitance of varactors 402 and 404 is adjusted by adjusting the voltage of Vtune. In one example, the capacitance of varactors 402 and 404 decrease as voltage Vtune increases. As further shown in FIG. 4a, resistor RE is coupled to the emitters of bipolar transistors Qa and Qb is used to implement current source IE shown in FIG. 2.

In some embodiments, inductors La and Lb may have variable or adjustable inductances and may be used to tune the frequency of the tank circuit in place of or in addition to varactors 402 and 404. In some embodiments, inductors La and Lb may be made adjustable by using switches coupled with inductive elements that switch the inductive elements in and out of the circuit, and/or by using other adjustable inductor structures known in the art. For example, the inductance of inductors La and Lb may be adjustable a differential voltage controlled inductor described in M. Tiebout, "A CMOS fully integrated 1 GHz and 2 GHz dual band VCO with voltage controlled inductor," in *Proc. European Solid-State Circuits Conf.* (*ESSCIRC*), 2002, pp. 799-802, which has been incorporated herein by reference in its entirety. In yet other embodiments, the tank may be tuned, for example, using a varactorless structure disclosed in. Kwok, J. R. Long, and J. J. Pekarik, "A 23-to-29 GHz differentially tuned varactorless VCO in 0.13 μm CMOS," in *IEEE Int. Solid-State Circuits Conf. Tech. Dig.*, Feb. 11-15, 2007, pp. 194-596, which has been incorporated herein by reference in its entirety. It should be appreciated that using variable inductances, variable capacitances and/or alternative tank tuning techniques may be applied to any of the disclosed embodiments.

In an alternative embodiment, the current for the bipolar transistors Qa and Qb may be supplied using current source IC coupled to power supply VCC as shown in FIG. 4b. Resistor RE may be optionally coupled between the emitters of bipolar transistors Qa and Qb and ground. Alternatively, RE may be omitted.

Figure 5:
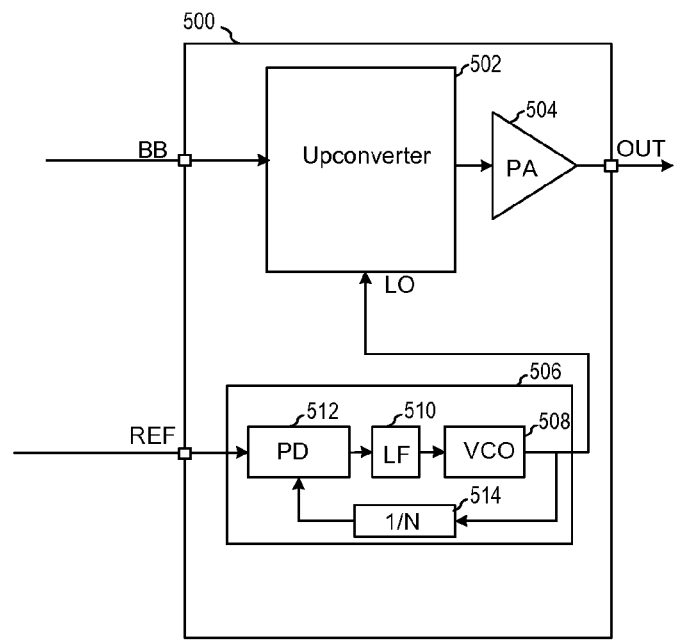
FIG. 5 illustrates a radar system using an embodiment oscillator.

FIG. 5 illustrates single-chip radar transmission system 500 that includes upconverter 502, power amplifier 504 and frequency generation circuit 506. As shown, upconverter 502 upconverts baseband signal BB to a higher frequency signal, which is then amplified by power amplifier 504 and output on pin OUT. In some embodiments, baseband signal BB may be a swept frequency or other signal type used in a radar system. Frequency generation circuit 506 produces local oscillator signal LO based on a reference frequency on pin REF that may be generated using, for example, a crystal oscillator. In an embodiment, frequency generation circuit 506 is implemented using a phase locked loop (PLL) having phase detector 512, loop filter 510, VCO 508 and divider 514. VCO 508 may be implemented using embodiment VCOs described herein. It should be appreciated that system 500 is just one of many examples of embodiment systems that may utilize embodiment oscillators. Alternative systems may include, for example, wireless and wire line communication systems, and other systems that use VCOs.

Figure 6:
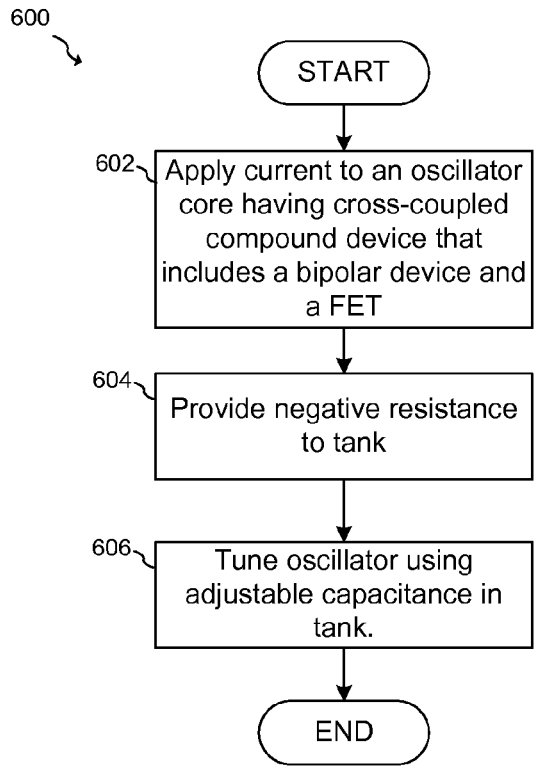
FIG. 6 illustrates a flowchart of an embodiment method.

FIG. 6 illustrates a flowchart 600 of an embodiment method of operating an oscillator. In step 602, a current is applied to an oscillator core coupled to tank circuit. In an embodiment, the oscillator core includes a plurality of cross-coupled compound transistors coupled to the tank circuit, wherein each of the plurality of compound transistors comprises a bipolar transistor and a field FET having a source coupled to a base of the bipolar transistor. As described above, the compound device formed by the FET and the bipolar transistor increases the headroom, thereby allowing the oscillator to have an increased amplitude of oscillation and lower phase noise in some embodiments. This current may be delivered to the oscillator core using a current source implemented, for example, by a resistor. Once the VCO core receives current, a negative resistance is formed in step 604. This negative resistance counteracts the resistance of the tank circuit and allows power to be transferred to the tank circuit in order to sustain oscillations.

In step 606, the frequency of the oscillator is tuned by adjusting a capacitance in the tank circuit. In some embodiments, the capacitance is adjusted by adjusting a voltage across a varactor diode within the tank circuit, in which case the oscillator is operated as a VCO. Alternatively, the varactor may be implemented as a MOS varactor, for example using a MOS device having its source and drain connected together. In this case the capacitance may be adjusted by applying a voltage between the gate of the MOS varactor and the source/drain connections of the MOS varactor. Alternatively, capacitance may be switched in and out of the tank circuit in order to select an oscillation frequency. In some embodiments, the switching of the capacitance may be controlled digitally such the oscillator operates as a digitally controlled oscillator (DCO).

Figure 7:
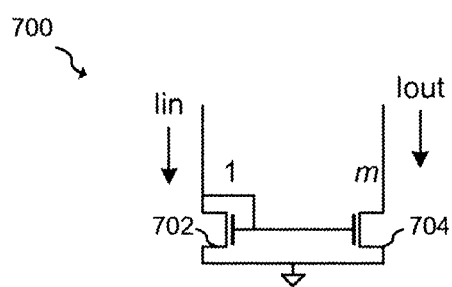
FIG. 7 illustrates an example current source that may be used to implement a current source in embodiment oscillators.

FIG. 7 illustrates current source 700 that may be used to implement current source IE in the embodiment oscillators shown in FIGS. 2 and 3. As shown, current 700 includes diode connected NMOS device 702 coupled to NMOS device 704. In an embodiment, current Iin is flows through NMOS device 702 and establishes a gate-source voltage in accordance with the input current. The gate source voltage of NMOS device 702 is applied to the gate and source of NMOS device 704, thereby causing a corresponding current Iout to flow through NMOS device 704. In an embodiment, Iout is approximately m*Iin, where m is the size ratio of NMOS device 704 with respect to NMOS device 702. Alternatively, current source 700 may implemented using other device types. For example a PMOS-based current mirror may be used to implement current source IC shown in FIG. 4*b*. In some embodiments, BJT transistors may be used in place of MOS device and/or degeneration resistors (not shown) may be coupled in series with the source and/or emitter nodes of the current source transistors. Alternatively, other current source structures known in the art may be used.

In accordance with an embodiment, an oscillator includes a tank circuit and an oscillator core circuit having a plurality of cross-coupled compound transistors coupled to the tank circuit. Each of the plurality of compound transistors includes a bipolar transistor and a field effect transistor (FET) having a source coupled to a base of the bipolar transistor. In some embodiments, a drain of the FET is coupled to a collector of the bipolar transistor. Alternatively, the drain of the FET may be coupled to a constant reference voltage. The oscillator may be disposed in a BiCMOS integrated circuit and/or may have a frequency of operation between about 10 GHz and about 30 GHz.

In an embodiment, the tank includes an inductance element and a capacitance element. A capacitance of the capacitance element may adjustable, and may be implemented using a varactor. The bipolar transistor may include a NPN transistor and the FET may include an n-channel metal-oxide field effect transistor (NMOS) device.

In accordance with a further embodiment, an oscillator includes a tank circuit, a first bipolar transistor having a first collector coupled to a first terminal of the tank circuit, a first field effect transistor (FET) having a first source coupled to a first base of the first bipolar transistor and a first gate coupled to a second terminal of the tank circuit, a second bipolar transistor having a second collector coupled to the second terminal of the tank circuit, and a second FET comprising a second source coupled to a second base of the second bipolar transistor and a second gate coupled to the first terminal of the tank circuit.

In an embodiment, the oscillator may further include a current source having a first terminal coupled to a first emitter of the first bipolar transistor and to a second emitter of the second bipolar transistor. The current source may include a resistor coupled between the first terminal of the current source and a first reference node.

In an embodiment, the first FET includes a first drain coupled to the first collector of the first bipolar transistor, and the second FET includes a second drain coupled to the second collector of the second bipolar transistor. Alternatively, the first FET includes a first drain coupled to a second reference node, and the second FET includes a second drain coupled to the second reference node. In an embodiment, the first FET and the second FET are implemented using n-channel metal-oxide semiconductor devices.

The tank circuit may include a first inductor coupled between the first terminal of the tank circuit and a power supply node, a second inductor coupled between the second terminal of the tank circuit and the power supply node, and an adjustable capacitance coupled between the first terminal of the tank circuit and the second terminal of the tank circuit. The adjustable capacitance may include, for example, a first varactor diode coupled between the first terminal of the tank circuit and a tuning node, and a second varactor diode couple between the second terminal of the tank circuit and the tuning node.

In accordance with a further embodiment, a method of operating an oscillator includes generating an oscillation signal at terminals of a tank circuit by applying a current to an oscillator core coupled to a tank circuit that includes a plurality of cross-coupled compound transistors coupled to the tank circuit. Each of the plurality of compound transistors includes a bipolar transistor and a field effect transistor (FET) having a source coupled to a base of the bipolar transistor. The method may further include tuning the oscillator via an adjustable capacitor in the tank circuit. In some embodiments, generating the oscillation signal further includes providing a negative resistance using the oscillator core.

Advantages of embodiments include low phase noise due to an increased amplitude of the oscillation signal. In one embodiment, a phase noise improvement of about 10 dB is achieved using embodiment compound devices compared to circuits using single bipolar transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:
1. An oscillator comprising:
a tank circuit; and
an oscillator core circuit comprising a plurality of cross-coupled compound transistors coupled to the tank circuit, wherein each of the plurality of compound transistors comprises a bipolar transistor and a field effect transistor (FET) having a source coupled to a base of the bipolar transistor, wherein a drain of the FET is coupled to a collector of the bipolar transistor.

2. An oscillator comprising:
a tank circuit; and
an oscillator core circuit comprising a plurality of cross-coupled compound transistors coupled to the tank circuit, wherein each of the plurality of compound transistors comprises a bipolar transistor and a field effect transistor (FET) having a source coupled to a base of the bipolar transistor, wherein a drain of the FET is coupled to a constant reference voltage.

3. The oscillator of claim 1, wherein the tank circuit comprises an inductance element and a capacitance element.

4. The oscillator of claim 3, wherein a capacitance of the capacitance element is adjustable.

5. The oscillator of claim 4, wherein the capacitance element comprises a varactor.

6. The oscillator of claim 3, wherein
an inductance of the inductance element is adjustable.

7. The oscillator of claim 1, wherein the bipolar transistor comprises a NPN transistor and the FET comprises an n-channel metal-oxide field effect transistor (NMOS) device.

8. The oscillator of claim 1, wherein the oscillator comprises a frequency of operation between about 10 GHz and about 30 GHz.

9. The oscillator of claim 1, wherein the oscillator is disposed on a BiCMOS integrated circuit.

10. An oscillator comprising:
a tank circuit;
a first bipolar transistor comprising a first collector coupled to a first terminal of the tank circuit;
a first field effect transistor (FET) comprising a first source coupled to a first base of the first bipolar transistor and a first gate coupled to a second terminal of the tank circuit, wherein the first FET comprises a first drain coupled to the first collector of the first bipolar transistor;
a second bipolar transistor comprising a second collector coupled to the second terminal of the tank circuit; and
a second FET comprising a second source coupled to a second base of the second bipolar transistor and a second gate coupled to the first terminal of the tank circuit, wherein the second FET comprises a second drain coupled to the second collector of the second bipolar transistor.

11. The oscillator of claim 10, further comprising a current source having a first terminal coupled to a first emitter of the first bipolar transistor and to a second emitter of the second bipolar transistor.

12. The oscillator of claim 11, wherein the current source comprises a current mirror.

13. The oscillator of claim 11, wherein the current source comprises a resistor coupled between the first terminal of the current source and a first reference node.

14. The oscillator of claim 10, wherein the tank circuit comprises:
a first inductor coupled between the first terminal of the tank circuit and a power supply node;
a second inductor coupled between the second terminal of the tank circuit and the power supply node; and
an adjustable capacitance coupled between the first terminal of the tank circuit and the second terminal of the tank circuit.

15. The oscillator of claim 14, wherein the adjustable capacitance comprises:
a first varactor diode coupled between the first terminal of the tank circuit and a tuning node; and
a second varactor diode coupled between the second terminal of the tank circuit and the tuning node.

16. The oscillator of claim 10, wherein the first FET and the second FET comprise n-channel metal-oxide semiconductor devices.

17. A method of operating an oscillator, the method comprising:
generating an oscillation signal at terminals of a tank circuit, generating comprising applying a current to an oscillator core coupled to a tank circuit comprising a plurality of cross-coupled compound transistors coupled to the tank circuit, wherein each of the plurality of compound transistors comprises a bipolar transistor and a field effect transistor (FET) having a source coupled to a base of the bipolar transistor, and a drain of the FET is coupled to a collector of the bipolar transistor or to a constant reference voltage.

18. The method of claim 17, further comprising tuning the oscillator via at least one of an adjustable capacitor and an adjustable inductor in the tank circuit.

19. The method of claim 17, wherein generating the oscillation signal further comprises providing a negative resistance using the oscillator core.

20. The oscillator of claim 2, wherein the tank circuit comprises an inductance element and an adjustable capacitance element.

21. The oscillator of claim 20, wherein the adjustable capacitance element comprises a varactor.

22. The oscillator of claim 2, wherein:
the oscillator is disposed on a BiCMOS integrated circuit;
the bipolar transistor comprises a NPN transistor; and
the FET comprises an n-channel metal-oxide field effect transistor (NMOS) device.

23. The oscillator of claim 2, wherein the oscillator comprises a frequency of operation between about 10 GHz and about 30 GHz.

24. An oscillator comprising:
a tank circuit comprising a first inductor coupled between a first terminal of the tank circuit and a power supply node, and a second inductor coupled between a second terminal of the tank circuit and the power supply node;
an adjustable capacitance coupled between the first terminal of the tank circuit and the second terminal of the tank circuit;
a first bipolar transistor comprising a first collector coupled to the first terminal of the tank circuit;
a first field effect transistor (FET) comprising a first source coupled to a first base of the first bipolar transistor and a first gate coupled to the second terminal of the tank circuit, wherein the first FET comprises a first drain coupled to the power supply node;
a second bipolar transistor comprising a second collector coupled to the second terminal of the tank circuit; and
a second FET comprising a second source coupled to a second base of the second bipolar transistor and a second gate coupled to the first terminal of the tank circuit, wherein the second FET comprises a second drain coupled to the power supply node.

* * * * *